United States Patent
Matsuzawa et al.

(10) Patent No.: US 6,700,192 B2
(45) Date of Patent: Mar. 2, 2004

(54) LEADFRAME AND METHOD OF MANUFACTURING A SEMICONDUCTOR DEVICE USING THE SAME

(75) Inventors: Hideki Matsuzawa, Nagano (JP); Shintaro Hayashi, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 10/265,311

(22) Filed: Oct. 7, 2002

(65) Prior Publication Data
US 2003/0071344 A1 Apr. 17, 2003

(30) Foreign Application Priority Data
Oct. 16, 2001 (JP) ............................ 2001-317692

(51) Int. Cl.⁷ ........................ H01L 23/52; H01L 23/495
(52) U.S. Cl. ...................... 257/692; 257/666; 257/667; 257/670
(58) Field of Search ................... 256/666, 692, 256/667, 670

(56) References Cited

U.S. PATENT DOCUMENTS 4,951,119 A * 8/1990 Yonemochi et al. ........ 257/666
6,424,032 B1 * 7/2002 Ikemoto et al. ............ 257/691
2003/0020146 A1 * 1/2003 Yee et al. .................. 257/666
2003/0082854 A1 * 5/2003 Kasahara et al. ........... 438/123

FOREIGN PATENT DOCUMENTS

JP    2001-320007    11/2001

* cited by examiner

Primary Examiner—Jasmine Clark
(74) Attorney, Agent, or Firm—Armstrong, Kratz, Quintos, Hanson & Brooks, LLP

(57) ABSTRACT

A leadframe used for a leadless package (a semiconductor device) such as a quad flat non-leaded package (QFN) includes a die-pad portion disposed in a center of an opening defined by a frame portion, and a plurality of lead portions extending from the frame portion toward the die-pad portion in a comb shape. A lead width of a portion along a circumference of a region to be ultimately divided as a semiconductor device, of each of the lead portions, is formed narrower than that of the other portion of the corresponding lead portions. In the leadframe, a plurality of die-pad portions are disposed, the frame portion is provided so as to surround each of the die-pad portions, and a plurality of lead portions corresponding to each of the die-pad portions extend from the frame portion surrounding the corresponding die-pad portion toward the corresponding die-pad portion. Moreover, an adhesive tape is attached to one surface of the leadframe.

7 Claims, 6 Drawing Sheets

PRIOR ART

LEADFRAME AND METHOD OF MANUFACTURING A SEMICONDUCTOR DEVICE USING THE SAME

BACKGROUND OF THE INVENTION (a) Field of the Invention

The present invention relates to a leadframe used as a base frame of packages for mounting semiconductor elements. More specifically, the present invention relates to a leadframe which is used in a leadless package (a surface mounting semiconductor device) such as a quad flat non-leaded package (QFN) and has a lead shape suitable for solving a problem attributable to "burrs" occurring upon dicing in an assembly process of the package, and to a method of manufacturing a semiconductor device using the leadframe.

(b) Description of the Related Art

FIG. 1A to FIG. 1C schematically show a constitution of a prior art leadframe for use in a leadless package such as QFN. In the drawings, FIG. 1A shows a plan-view constitution of a portion of the leadframe, FIG. 1B shows a cross-sectional structure of the leadframe viewed along A–A' line in FIG. 1A, and FIG. 1C shows a cross-sectional structure of the leadframe viewed along B–B' line in FIG. 1A, respectively.

In FIG. 1A to FIG. 1C, reference numeral 10 denotes a leadframe used as a substrate of the QFN. The leadframe 10 is basically composed of a base frame 11 obtained by patterning a metal plate such as a copper (Cu) plate. The leadframe 10 is formed such that die-pad portions 12 and lead portions 13 around the die-pad portions 12 are demarcated for respective semiconductor elements to be mounted thereon. Moreover, reference numeral 14 denotes frame portions. The respective lead portions 13 extend from the frame portions 14 toward the die-pad portions 12 in a comb shape. Also, each of the die-pad portions 12 is supported by four support bars 15 extending from four corners of the frame portion 14.

Also, a metal film 16 is formed on the entire surface of the base frame 11, and an adhesive tape 17 is adhered to a back surface (a lower plane in the illustrated example) of the base frame 11. Adhesion (taping) of the adhesive tape 17 is basically performed as a countermeasure for preventing a leakage (which is also referred to as "mold flush") of molding resin to the back surface of the frame upon molding in a package assembly process to be carried out at a later stage.

Also, reference symbol w1 denotes a lead width of each lead portion 13, and reference symbol d1 denotes an interval (a lead interval) between two adjacent lead portions 13. The respective lead portions 13 extend from the frame portions 14 in a comb shape with a constant lead width w1 (FIG. 1A). Moreover, broken lines CL show dividing lines for dividing the leadframe ultimately into respective packages in the package assembly process to be carried out at a later stage.

When a package (a semiconductor device) is assembled using the leadframe 10 having the above-described constitution, the basic process thereof includes the steps of mounting semiconductor elements on the die-pad portions of the leadframe (die bonding), electrically connecting electrodes of the semiconductor elements to the lead portions of the leadframe with bonding wires (wire bonding), sealing the semiconductor elements, the bonding wires and the like with molding resin (molding), dividing the leadframe into packages (semiconductor devices) after peeling off the adhesive tape (dicing), and the like. Also, as the type of molding, there are an individual molding in which the semiconductor elements are individually sealed with resin, and a mass molding in which the semiconductor elements are sealed together with resin. Since the individual molding has a difficulty in terms of efficient package assembly as compared to the mass molding, the mass molding has been a mainstream in recent years.

FIG. 2A and FIG. 2B schematically show a constitution of a semiconductor device fabricated using the above-described leadframe 10. In the drawings, FIG. 2A shows a cross-sectional structure of the semiconductor device viewed along A–A' line in FIG. 1A, and FIG. 2B shows a cross-sectional structure of the semiconductor device viewed along B–B' line in FIG. 1A, respectively.

In a semiconductor device 20 as exemplified in FIG. 2A, reference numeral 21 denotes a semiconductor element mounted on the die-pad portion 12; reference numeral 22 denotes bonding wires electrically connecting respective electrodes of the semiconductor element 21 to the respective lead portions 13; and reference numeral 23 denotes molding resin for protecting the semiconductor element 21, the bonding wires 22 and the like. Also, reference symbol BR denotes "burrs" of metal generated from the lead portions 13. Such burrs BR are generated on downstream sides of the cutting directions in the event of simultaneously cutting the metal (the lead portions 13) and the resin (the molding resin 23) along the dividing lines CL (FIG. 1A) with a dicer or the like in the dicing step of the above-described package assembly process.

In the assembly process of the packages (the semiconductor devices) such as QFN utilizing the mass molding, the burrs BR tend to be generated from the lead portions 13 as described above in the event of dicing the leadframe into the packages.

Where the burrs BR are generated, the adjacent lead portions 13 may be electrically short-circuited as exemplified in FIG. 2B. As a result, there arises a disadvantage in that a productivity or a yield falls off, whereby a reliability of the packages (the semiconductor devices) as end products is degraded.

One of conceivable countermeasures for such a disadvantage is to widen the interval (the lead interval d1) between the adjacent lead portions 13. However, the lead interval d1 is selected to a specific value in an allowable range determined by a relationship between the size of the package and the number of external terminals required for the package. Accordingly, there is a limitation in the approach to widen the lead interval d1.

Meanwhile, the present inventors have carried out a series of experiments by means of varying roughness of a blade of a dicer and varying processing speed upon dicing. As a result, it has proved that generation of the burrs becomes more significant as the blade of the dicer is made relatively finer and the processing speed is controlled relatively slower.

For this reason, optimum conditions (the most appropriate roughness of the blade and the processing speed) for minimizing generation of the burrs are sought for each combination of a material of the metal and a material of the resin, and the dicing process is carried out based on the conditions. As a result, a complicated process is required for manufacturing a semiconductor device with fewer burrs. Eventually, there is a problem of an increase in cost in association therewith.

SUMMARY OF THE INVENTION

An object of the present invention is to provide a leadframe and a method of manufacturing a semiconductor device using the leadframe, in which the leadframe is capable of effectively preventing a short circuit between adjacent lead portions even if burrs are generated upon dicing in an assembly process of the semiconductor device, thereby capable of enhancing a reliability of the semiconductor device, and also capable of contributing to shortening its manufacturing period and to decreasing its manufacturing cost.

To attain the above object, according to one aspect of the present invention, there is provided a leadframe including a die-pad portion disposed in a center of an opening defined by a frame portion; a plurality of lead portions extending from the frame portion toward the die-pad portion in a comb shape; and a lead width of a portion along a circumference of a region to be ultimately divided as a semiconductor device, of each of the lead portions, being formed narrower than a lead width of the other portion of the corresponding lead portion.

According to the leadframe of this aspect, the lead width of the portion to be detached from the frame portion (namely, the portion along the circumference of the region to be ultimately divided as the semiconductor device) upon assembly of a package (a semiconductor device) at a later stage is formed relatively narrower. Accordingly, a lead interval corresponding to this portion (a lead interval to be ultimately exposed from the package) is made relatively wider.

Therefore, even if burrs are generated from the lead portions upon dicing, a short circuit between the adjacent lead portions does not substantially occur. In this way, it is possible to virtually prevent occurrence of such a short circuit. Such an advantage contributes to an enhancement in reliability of the semiconductor device as an end product, to shortening its manufacturing period and to decreasing its manufacturing cost.

Moreover, according to another aspect of the present invention, there is provided a method of manufacturing a semiconductor device using the leadframe of the above-described aspect, which includes the steps of mounting semiconductor elements severally on the die-pad portions of the leadframe, electrically connecting respective electrodes of the semiconductor elements to a plurality of lead portions, corresponding to the respective electrodes of the semiconductor elements, of the leadframe, severally with bonding wires, sealing the semiconductor elements, the bonding wires and the lead portions with molding resin, peeling off the adhesive tape, and dividing the leadframe sealed with the molding resin into respective semiconductor devices along dividing lines passing across the narrowly-formed portions of the plurality of lead portions.

DESCRIPTION OF THE PREFERRED EMBODIMENTS

Figure 3A:
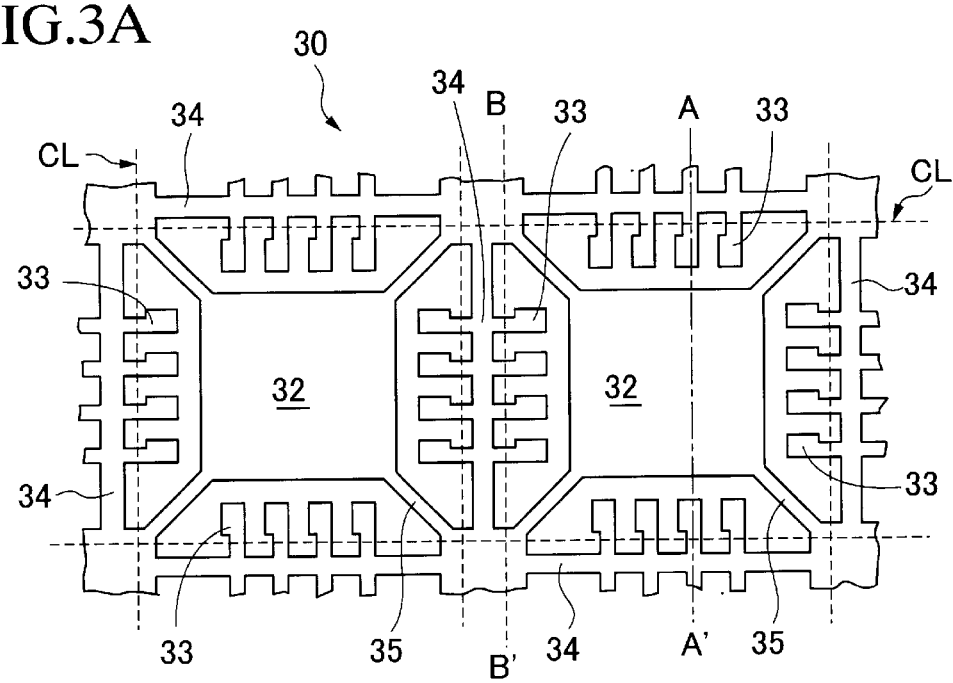
FIG. 3A to FIG. 3C are views schematically showing a constitution of a leadframe according to one embodiment of the present invention.
Figure 3B:
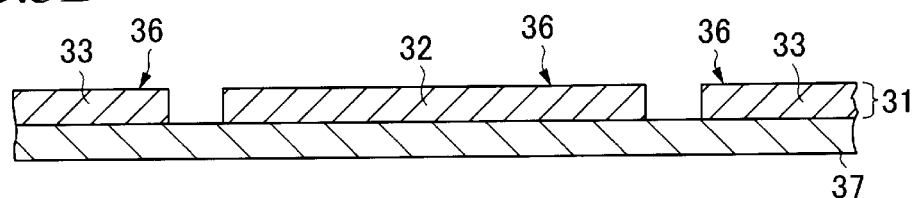
Figure 3C:
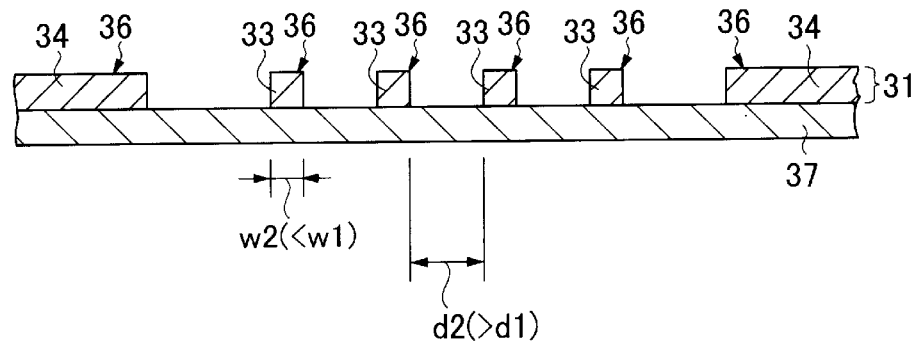

FIG. 3A to FIG. 3C schematically show a constitution of a leadframe according to one embodiment of the present invention for use in a leadless package such as a QFN. In the drawings, FIG. 3A shows a plan-view constitution of a portion of the leadframe; FIG. 3B shows a cross-sectional structure of the leadframe viewed along A–A' line in FIG. 3A; and FIG. 3C shows a cross-sectional structure of the leadframe viewed along B–B' line in FIG. 3A, respectively.

Figure 1A:
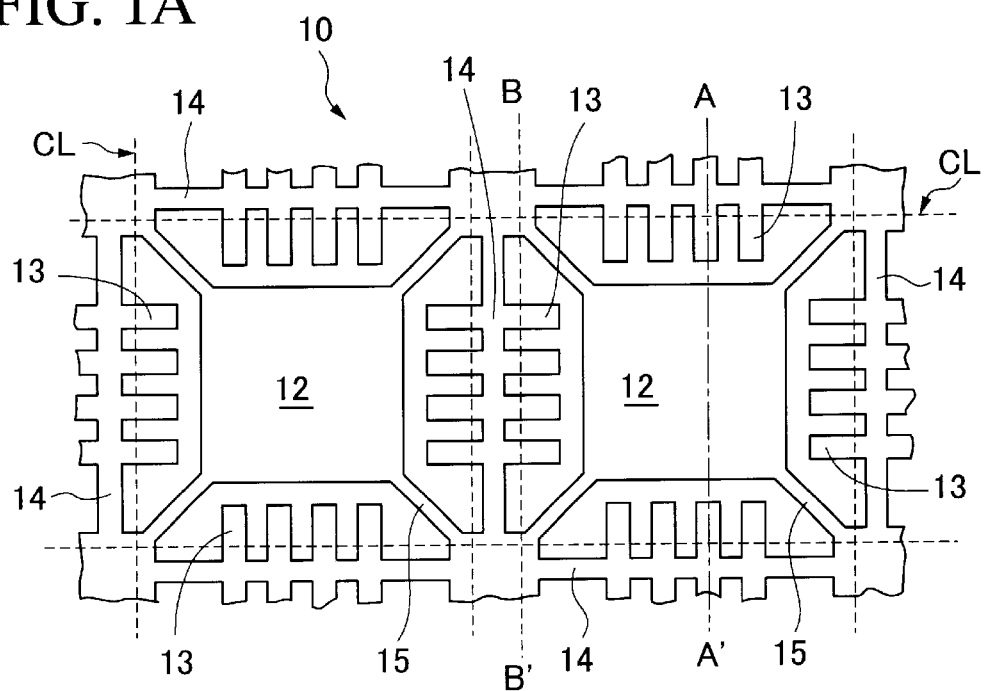
FIG. 1A to FIG. 1C are views schematically showing a constitution of a prior art leadframe.
Figure 1B:
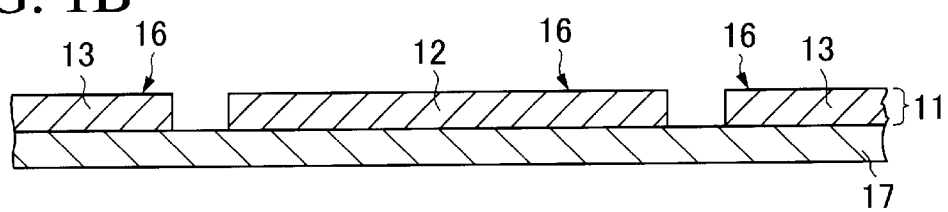
Figure 1C:
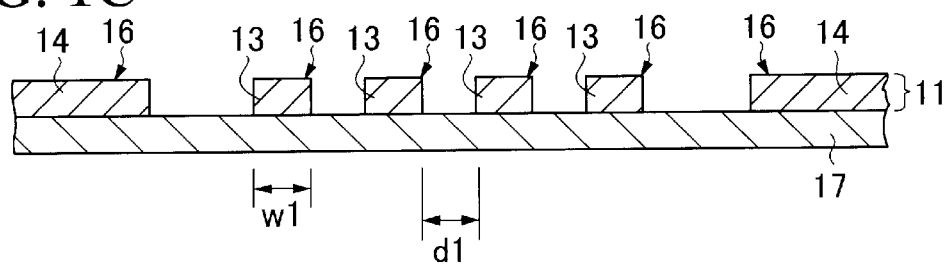

A leadframe 30 of this embodiment basically includes the same constitution as the leadframe 10 shown in FIG. 1A to FIG. 1C. Namely, the leadframe 30 is basically composed of a base frame 31 obtained by patterning a metal plate. The leadframe 30 is formed such that die-pad portions 32 and lead portions 33 around the die-pad portions 32 are demarcated for respective semiconductor elements to be mounted thereon. Moreover, reference numeral 34 denotes frame portions. The respective lead portions 33 extend from the frame portions 34 toward the die-pad portions 32 in a comb shape. Also, each of the die-pad portions 32 is supported by four support bars 35 extending from four corners of the frame portion 34. Each of the lead portions 33 is composed of an inner lead portion to be electrically connected to an electrode of a semiconductor element, and an outer lead portion (an external connection terminal) to be electrically connected to a wiring on a packaging substrate. Moreover, a metal film (plating film) 36 is formed on the entire surface of the base frame 31, and an adhesive tape 37 is adhered to a back surface (a lower plane in the illustrated example) of the base frame 31 in order to mainly prevent a mold flush. Furthermore, reference symbol w2 denotes a lead width of each lead portion 33, reference symbol d2 denotes an interval (a lead interval) between two adjacent lead portions 33, and broken lines CL show dividing lines.

As described later in conjunction with a method of manufacturing a semiconductor device using the leadframe, the leadframe 30 of this embodiment is characterized in that the lead width w2 of the portion where each of the lead portions 33 is detached from the frame portion 34 (the portion where the dividing line CL passes) upon assembly of the semiconductor device is formed narrower than the lead width w1 of other portions (w2<w1). In other words, the leadframe 30 is formed such that the lead interval d2 corresponding to the narrowly-formed portion (the lead width w2) is made wider than the lead interval d1 corresponding to other portions (the lead width w1) (d2>d1).

Here, the lead width w1 and the lead interval d1 are the same as the lead width w1 and the lead interval d1 of the lead portion 13 shown in FIG. 1A to FIG. 1C, respectively. Namely, in the prior art (FIG. 1A to FIG. 1C), the respective lead portions 13 extend from the frame portion 14 in a comb shape with the constant lead width w1, while in this embodiment (FIG. 3A to FIG. 3C), the respective lead portions 33 extend from the frame portion 34 in a comb shape for a predetermined distance with the relatively narrower lead width w2 and further extend with the lead width w1.

Incidentally, where the leadframe 30 (the base frame 31) is formed by etching, the lead width w2 of the narrowly-formed portion can be set to 100 μm or less.

According to the constitution of the leadframe 30 of this embodiment, the lead width w2 of the portion to be detached from the frame portion 34, of each lead portion 33, upon assembly of the package (the semiconductor device) is formed relatively narrower (w2<w1). Accordingly, the lead interval d2 corresponding to this portion (the lead width w2) becomes relatively wider (d2>d1).

Figure 4A:
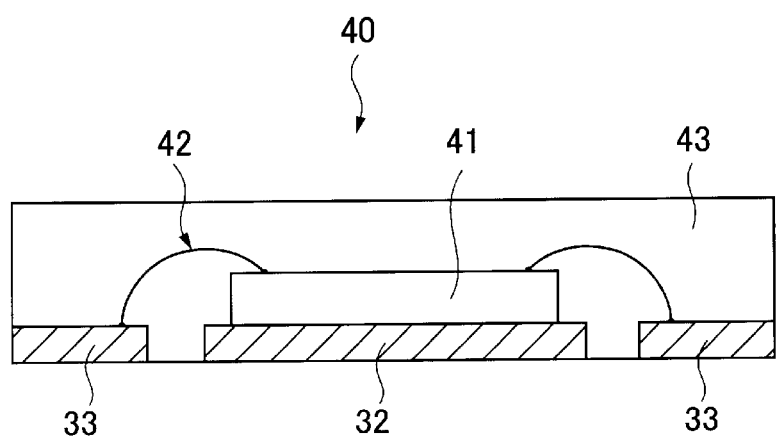
FIG. 4A and FIG. 4B are cross-sectional views schematically showing a constitution of a semiconductor device fabricated using the leadframe shown in FIG. 3A to FIG. 3C.
Figure 4B:
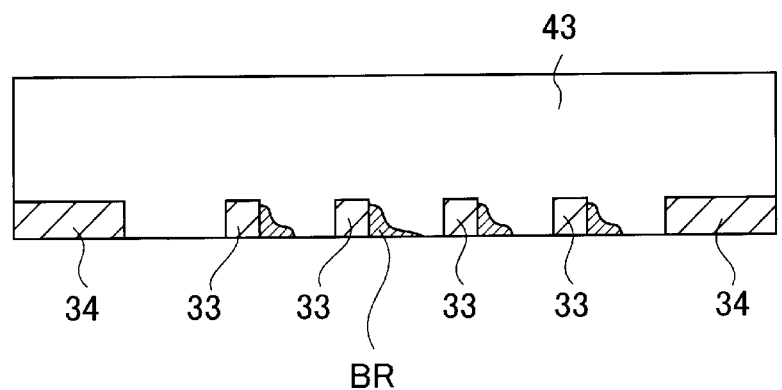
Figure 5A:
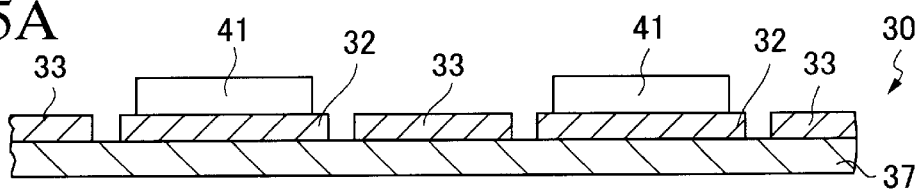
FIG. 5A to FIG. 5E are cross-sectional views showing a manufacturing process of the semiconductor device shown in FIG. 4A.
Figure 5B:
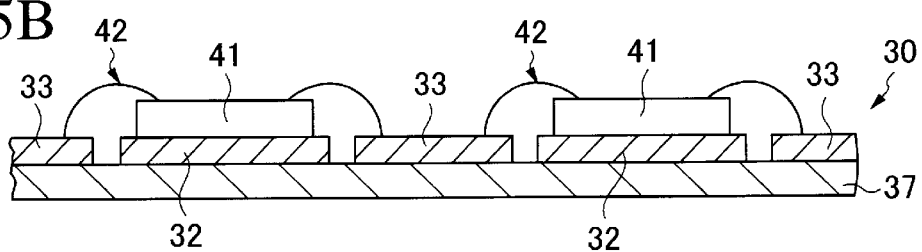
Figure 5C:
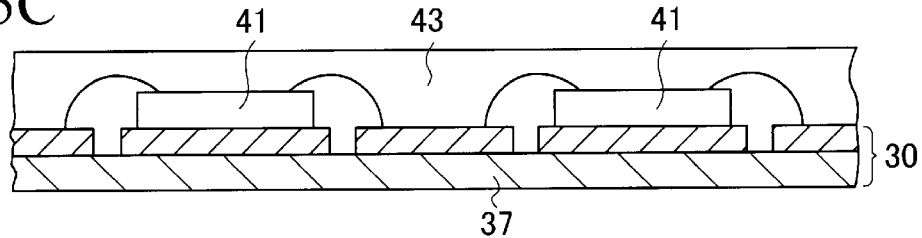
Figure 5D:
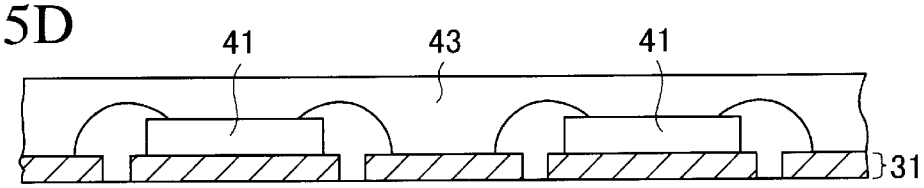
Figure 5E:
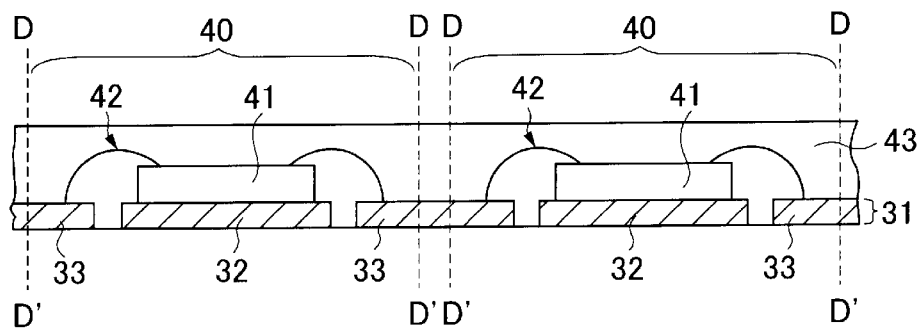

Therefore, even if burrs BR are generated from the lead portions 33 as shown in FIG. 4B in the event of dicing for dividing into the packages, a short circuit between the adjacent lead portions 33 does not substantially occur, and thereby occurrence of the short circuit can be virtually avoided. In this way, it is possible to enhance a reliability of the package (the semiconductor device) as an end product, to shorten its manufacturing period, and to reduce its manufacturing cost.

Also, in the prior art, it is necessary to find the optimum conditions severally regarding roughness of a dicing blade and processing speed depending on types of metal and resin materials for minimizing generation of the burrs BR, which is attributable to relative narrowness of the lead interval d1 on the circumferential sides of the ultimate package. On the contrary, in this embodiment, the lead interval d2 is made relatively wider as described above. Accordingly, it is not necessary to find the precise conditions as in the prior art. As a result, it is possible to shorten a period required for manufacturing the leadframe with fewer burrs, and to achieve a reduction in manufacturing cost.

Furthermore, an allowable range for the burrs BR is widened since the lead interval d2 is relatively widened. Accordingly, the processing speed of dicing can be increased, which contributes to a reduction in the manufacturing cost.

Although it is not illustrated in particular, the leadframe 30 of this embodiment can be manufactured by a series of processes including patterning a metal plate by etching or stamping, electrolytic plating and the like, which are already known to those skilled in the art. In the following, description will be made regarding an example of the manufacturing method.

First, a metal plate is patterned into the shape as illustrated in the plan-view constitution of FIG. 3A by means of etching or stamping to form the base frame 31. Copper (Cu), a Cu-based alloy, iron-nickel (Fe—Ni), a Fe—Ni-based ally, or the like is used as the material for the metal plate.

Next, the metal film 36 is formed on the entire surface of the base frame 31 by electrolytic plating. For example, nickel (Ni) is plated on the surface of the base frame 31 for the purpose of enhancing adhesion while using the base frame 31 as a feed layer, then palladium (Pd) is plated thereon for the purpose of enhancing conductivity, and gold (Au) is further plated on the Pd layer to form the metal film (Ni/Pd/Au) 36.

Finally, the adhesive tape 37 made of epoxy resin, polyimide resin, polyester resin or the like, is attached to the back surface (which is the lower surface in the example shown in FIG. 3B and FIG. 3C) of the base frame 31, whereby the leadframe 30 is obtained.

FIG. 4A and FIG. 4B schematically show a constitution of a semiconductor device manufactured using the leadframe 30 of this embodiment. In the drawings, FIG. 4A shows a cross-sectional structure of the semiconductor device viewed along A–A' line in FIG. 3A, and FIG. 4B shows a cross-sectional structure of the semiconductor device viewed along B–B' line in FIG. 3A, respectively.

Figure 2A:
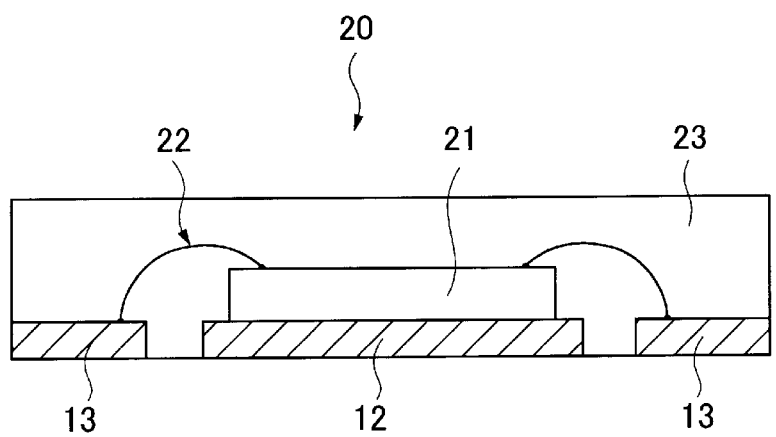
FIG. 2A and FIG. 2B are cross-sectional views schematically showing a constitution of a semiconductor device fabricated using the leadframe shown in FIG. 1A to FIG. 1C.
Figure 2B:
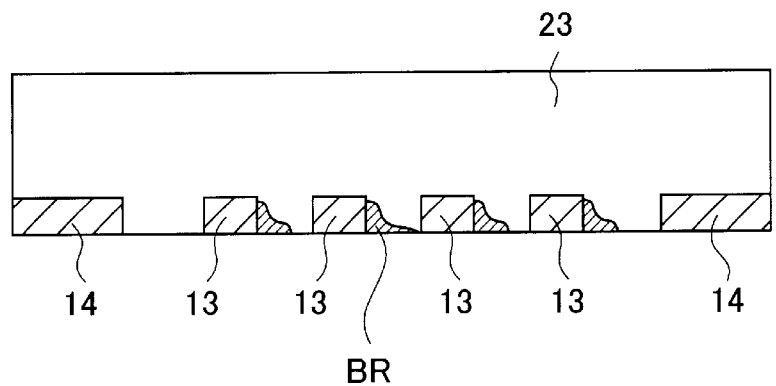

In the illustrated semiconductor device 40, reference numeral 41 denotes a semiconductor element mounted on the die-pad portion 32; reference numeral 42 denotes bonding wires for electrically connecting respective electrodes of the semiconductor element 41 to the respective lead portions 33; and reference numeral 43 denotes molding resin for protecting the semiconductor element 41, the bonding wires 42 and the like. Also, reference symbol BR denotes burrs of metal generated from the lead portions 33 in the dicing step of the package assembly process to be described later. The burrs BR are equivalent to those illustrated in the conventional example (FIG. 2B).

Now, description will be made regarding a method of manufacturing the semiconductor device 40 with reference to FIG. 5A to FIG. 5E, which severally show the steps in the manufacturing process thereof.

In the first step (FIG. 5A), the leadframe 30 is held with a holder jig (not shown) while putting the surface attaching the adhesive tape 37 downward, and the semiconductor elements 41 are mounted severally on the respective die-pad portions 32 of the leadframe 30. To be more precise, an adhesive such as epoxy resin is coated on the die-pad portions 32 and bottom surfaces (opposite surfaces to the surfaces where the electrodes are formed) of the semiconductor elements 41 are set downward, whereby the semiconductor elements 41 are adhered to the die-pad portions 32 with the adhesive.

In the next step (FIG. 5B), the electrodes of the respective semiconductor elements 41 and the corresponding lead portions 33 on one surface of the leadframe 30 (which is the upper side in the illustrated example) are electrically connected with the bonding wires 42 severally. In this way, the respective semiconductor elements 41 are mounted on the leadframe 30.

It should be noted that the each lead portion 33 is owned in common by two adjacent die-pad portions 32 at this stage, as can be understood from the plan-view structure shown in FIG. 3A.

In the next step (FIG. 5C), the entire surface of the leadframe 30 on the side where the semiconductor elements 41 are mounted is sealed with the molding resin 43 according to a mass molding. Although it is not particularly illustrated in the drawing, such sealing is performed by disposing the leadframe 30 on a lower molding die (a pair of upper and lower dies) and binding the leadframe 30 with the upper die from above, and then by filling the molding resin 43. For example, transfer molding is used as the means for sealing.

In the next step (FIG. 5D), the leadframe 30 (FIG. 5C) sealed with the molding resin 43 is taken out of the molding dies, and then the adhesive tape 37 is peeled off and removed from the base frame 31.

In the final step (FIG. 5E), the base frame 31 (the leadframe mounted with each semiconductor element 41 and sealed with the molding resin 43 on the entire surface thereof) is divided into package units along dividing lines D–D' as illustrated with broken lines using a dicer or the like, such that each package unit includes one semiconductor element 41. Here, the dividing lines D–D' are aligned with the dividing lines CL illustrated with the broken lines in FIG. 3A, i.e., with the lines passing across the portions where the lead width of the respective lead portions 33 is formed narrow (the lead width w2).

By the above-mentioned steps, the semiconductor device 40 (FIG. 4A) having a QFN package structure is fabricated.

Although the foregoing embodiment has described the example of the leadframe 30 having the lead shape (the lead portions 33) as shown in FIG. 3A and the method of manufacturing the semiconductor device 40 using the leadframe 30, it is needless to say that the lead shape of the lead portions is not limited to the example as shown in FIG. 3A.

As it is obvious from the gist and the constitution described herein, the present invention is similarly applicable to other leadframes as long as the leadframes include the lead portions (the lead shapes) in which the lead width w2 of the portions to be detached from the frame portions 34 upon assembly of the packages (the semiconductor devices) is made relatively narrower.

FIG. 6A to FIG. 6G schematically show constitutions of various modified examples, which are derived from the lead portions 33 (the lead shapes) exemplified in FIG. 3A.

Figure 6D:
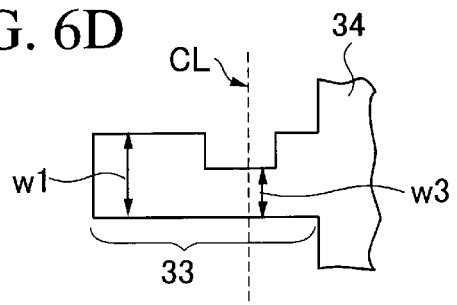
FIG. 6A to FIG. 6G are views showing various modified examples of a lead portion (a lead shape) in the leadframe shown in FIG. 3A.
Figure 6A:
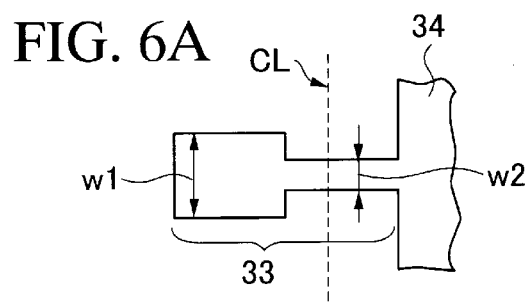
Figure 6E:
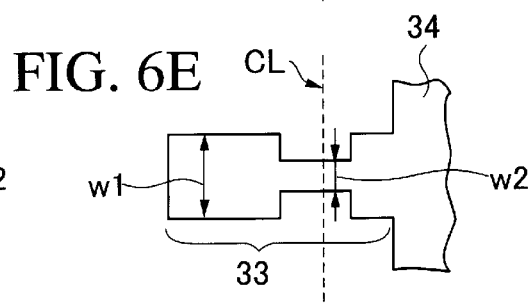
Figure 6B:
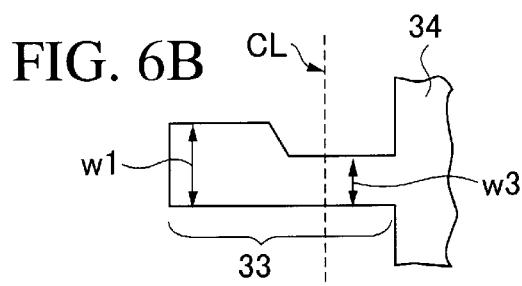
Figure 6F:
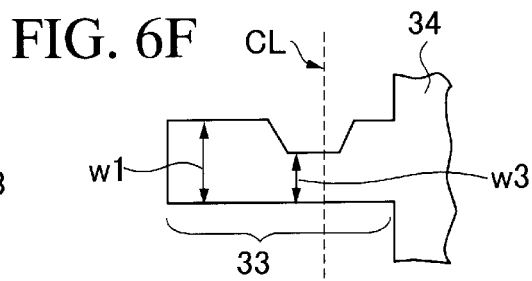
Figure 6C:
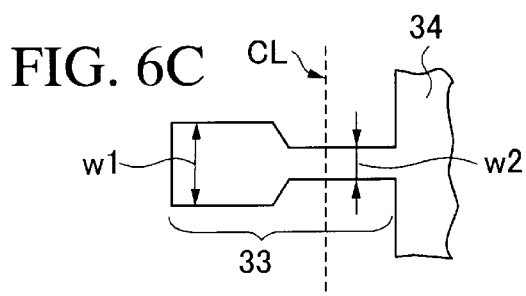
Figure 6G:
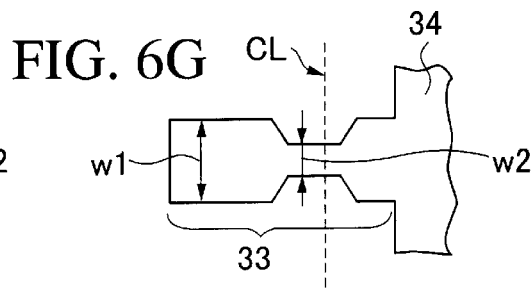

FIG. 6A shows a lead shape in which a lead width w2 of a portion to be detached from a frame portion 34 (a portion where a dividing line CL passes) is formed narrower by reducing both sides of a lead portion 33. FIG. 6B shows a lead shape in which a line from a portion having a relatively wider lead width w1 to a portion having a relatively narrower lead width w3 is cut into a taper. FIG. 6C is a lead shape derived from the lead shape of FIG. 6B, in which a lead width w2 of a portion to be detached from a frame portion 34 is formed narrower by reducing both sides of a lead portion 33. FIG. 6D shows a lead shape derived from the lead shape exemplified in FIG. 3A, in which a portion of a lead portion 33 to be formed into a relatively narrower lead width w3 is limited to a part thereof (to one side of the lead portion). FIG. 6E shows a lead shape derived from the lead shape of FIG. 6A, in which a portion of a lead portion 33 to be formed into a narrower lead width w2 is formed in an intermediate position of the lead portion by reducing the width from both sides. FIG. 6F shows a lead shape derived from the lead shape of FIG. 6B, in which a portion of a lead portion 33 to be formed into a narrower lead width w3 is formed in an intermediate position of the lead portion by reducing the width from one side. FIG. 6G shows a lead shape derived from the lead shape of FIG. 6C, in which a portion of a lead portion 33 to be formed into a narrower lead width w2 is formed in an intermediate position of the lead portion by reducing the width from both sides.

What is claimed is:

1. A leadframe comprising regions for mounting semiconductor devices, wherein the leadframe is to be divided along dividing lines on the leadframe to separate the regions and the semiconductor devices mounted on the regions, wherein respective dividing lines of the leadframe comprise a circumference of each region of the leadframe; each said region comprising:
   a die-pad portion disposed in a center of an opening defined by a frame portion; and
   a plurality of lead portions extending inward from the frame portion toward the die-pad portion in a comb shape;
   wherein the lead portions each have
      a first width at a respective innermost end that is closest to the die-pad portion, and
      a second width at the circumference of the region crossed by one of the dividing lines,
      wherein the second width is narrower than the first width.

2. The leadframe according to claim 1, wherein a plurality of said die-pad portions are disposed, said frame portion is provided to surround each of the die-pad portions, and a plurality of lead portions corresponding to each of the die-pad portions extend from the frame portion surrounding the corresponding die-pad portion toward the corresponding die-pad portion.

3. The leadframe according to claim 2, wherein an adhesive tape is attached to one surface of said leadframe.

4. The leadframe according to claim 1,
A leadframe comprising regions for mounting semiconductor devices, wherein the leadframe is to be divided along dividing lines on the leadframe to separate the regions and the semiconductor devices mounted on the regions; the leadframe comprising:
   a die-pad portion disposed in a center of an opening defined by a frame portion;
   a plurality of lead portions extending from the frame portion toward the die-pad portion in a comb shape; and
   a lead width of a portion along a circumference of the region, of each of said lead portions, being formed narrower than a lead width of the other portion of the corresponding lead portion;
   wherein the lead width of the narrowly-formed portion of each of said lead portions is selected to be below 100 micrometers.

5. The leadframe according to claim 1, wherein said lead portions are used as external connection terminals when the leadframe is divided as semiconductor devices, and the lead portions are exposed to a peripheral part in the side of a mounting plane of the corresponding semiconductor device.

6. A method of manufacturing a semiconductor device using a leadframe comprising regions for mounting semiconductor devices, wherein the leadframe is to be divided along dividing lines on the leadframe to separate the regions and the semiconductor devices mounted on the regions; the leadframe comprising:
   a die-pad portion disposed in a center of an opening defined by a frame portion;
   a plurality of lead portions extending from the frame portion toward the die-pad portion in a comb shape; and
   a lead width of a portion along a circumference of the region, of each of said lead portions, being formed narrower than a lead width of the other portion of the corresponding lead portion;
   wherein an adhesive tape is attached to one surface of said leadframe;
   the method comprising the steps of:
      mounting semiconductor elements severally on each of the die-pad portions of said leadframe;
      electrically connecting respective electrodes of the semiconductor elements to a plurality of lead portions, corresponding to the respective electrodes of the semiconductor elements, of said leadframe, severally with bonding wires;
      sealing the semiconductor elements, the bonding wires and the plurality of lead portions with molding resin;
      peeling off said adhesive tape; and
      dividing the leadframe sealed with the molding resin into respective semiconductor devices along dividing lines passing across the narrowly-formed portions of said plurality of lead portions.

7. The method according to claim 6, wherein said sealing with the molding resin is carried out by a mass molding in which an entire surface on a side where the semiconductor elements are mounted, of said leadframe, is sealed with resin.

* * * * *